(12) United States Patent
Kim et al.

(10) Patent No.: US 7,656,087 B2
(45) Date of Patent: Feb. 2, 2010

(54) FLAT PANEL DISPLAY

(75) Inventors: Mu-Hyun Kim, Suwon-si (KR); Myung-Won Song, Suwon-si (KR); Yu-Sung Cho, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 375 days.

(21) Appl. No.: 10/938,080

(22) Filed: Sep. 10, 2004

(65) Prior Publication Data

US 2005/0116630 A1 Jun. 2, 2005

(30) Foreign Application Priority Data

Nov. 27, 2003 (KR) .................. 10-2003-0084786

(51) Int. Cl.
*H01J 1/62* (2006.01)
*H01J 63/04* (2006.01)

(52) U.S. Cl. .................. 313/509; 313/504; 313/506

(58) Field of Classification Search .......... 313/495–512
See application file for complete search history.

(56) References Cited

U.S. PATENT DOCUMENTS

| | | | |
|---|---|---|---|
| 5,684,365 A | 11/1997 | Tang et al. | |
| 5,895,937 A | 4/1999 | Su et al. | |
| 6,246,179 B1 | 6/2001 | Yamada | |
| 6,252,297 B1 * | 6/2001 | Kemmochi et al. | 257/640 |
| 6,605,497 B2 | 8/2003 | Yamazaki et al. | |
| 2002/0063515 A1 * | 5/2002 | Goto | 313/500 |
| 2002/0140643 A1 * | 10/2002 | Sato | 345/76 |
| 2003/0076452 A1 * | 4/2003 | Kim et al. | 349/43 |
| 2003/0094894 A1 | 5/2003 | Andry et al. | |
| 2003/0201716 A1 * | 10/2003 | Yamazaki et al. | 313/506 |
| 2004/0017162 A1 * | 1/2004 | Sato et al. | 315/169.3 |
| 2005/0116631 A1 * | 6/2005 | Kim et al. | 313/506 |
| 2005/0224820 A1 * | 10/2005 | Yamazaki et al. | 257/79 |

FOREIGN PATENT DOCUMENTS

CN 1355561 A 6/2002

(Continued)

OTHER PUBLICATIONS

Office Action for corresponding European Patent Application No. 04 090 473.2-1528 dated Mar. 10, 2006.

(Continued)

*Primary Examiner*—Peter Macchiarolo
(74) *Attorney, Agent, or Firm*—Christie, Parker & Hale, LLP.

(57) ABSTRACT

A flat panel display capable of reducing element defects by decreasing taper angles of contact holes and a via hole. The flat panel display includes a thin film transistor having at least source and drain electrodes formed over an insulating substrate, an insulating layer having a via hole for exposing one of the source and drain electrodes, and an anode connected to said one of the source and drain electrodes through the via hole. The via hole and the anode are tapered with taper angles of 60° or less. The source and drain electrodes are connected respectively to source and drain regions of the thin film transistor through the contact holes. The contact holes are also tapered with taper angles of 60° or less.

30 Claims, 17 Drawing Sheets

FOREIGN PATENT DOCUMENTS

| | | |
|---|---|---|
| EP | 0 888 035 A1 | 12/1998 |
| JP | 64-030228 | 2/1989 |
| JP | 64-033971 | 2/1989 |
| JP | 09-55508 | 2/1997 |
| JP | 10-104659 | 4/1998 |
| JP | 10-148845 | 6/1998 |
| JP | 10-206888 | 8/1998 |
| JP | 2001-110566 | 4/2001 |
| JP | 2002-208491 | 7/2002 |
| JP | 2003-249370 | 9/2003 |
| KR | 1999-0037169 | 5/1999 |
| KR | 2000-0076954 | 12/2000 |
| KR | 2001-0003764 | 1/2001 |
| KR | 2001-0065304 | 7/2001 |
| KR | 2002-0065225 | 8/2002 |
| KR | 2002-0074897 | 10/2002 |

OTHER PUBLICATIONS

Korean Office action, dated Oct. 7, 2005, for Korean Patent Application No. 10-2003-0084786.
Patent Abstracts of Japan for Publication No. 2002-208491, Date of publication of application: Jul. 26, 2002, in the name of Yasumasa Goto.
Korean Patent Abstracts for Publication No. 1020010003764; Date of publication of application Jun. 25, 1999, in the name of Seong Hu Ju et al.
Summons to attend oral proceedings dated Jul. 17, 2008, for corresponding European Patent Application No. 04090473.2, indicating relevance of the U.S. patent applications.
Japanese Office action, Application No. 2004-344946, dated Oct. 28, 2008 indicating relevance of the above-references and of JP08-234683 previously filed in an IDS on Jul. 31, 2008.
Patent Abstracts of Japan, for publication No. 10-148845, published on Jun. 2, 1998 in the name of Okita et al.
Patent Abstracts of Japan, Publication No. 10-206888, published on Aug. 7, 1998 in the name of Nagata et al.
Patent Abstracts of Japan, Publication No. 2001-110566, published on Apr. 20, 2001, in the name of Suzuki.
Patent Abstracts of Japan, Publication No. 2003-249370, published on Sep. 5, 2003 in the name of Choi et al.
Patent Abstracts of Japan, Publication No. 64-030228, published on Feb. 1, 1989 in the name of Hashimoto et al.
Patent Abstracts of Japan, Publication No. 64-033971, published on Feb. 3, 1989 in the name of Keyakida et al.
Japanese Decision of Rejection dated Mar. 31, 2009 for corresponding Japanese Patent Application No. 2004-344946 identifying references JP 9-55508 and JP 10-104659. The remainder of the references cited in the Decision were previously cited in IDS's filed Jul. 31, 2008 and Nov. 21, 2008.
Chinese certificate for corresponding Chinese Patent Application No. 200410011802.9 dated Oct. 1, 2008 identifying reference CN 1355561 A. The remainder of the references cited in the Certificate were previously cited in IDS's filed Jan. 25, 2006 and Jun. 20, 2006, and the Notice of Allowance dated Jun. 18, 2008.
Korean Office action dated Dec. 12, 2005 for related Korean Patent Application No. 10-2001-0014965 (Korean Publication 10-2002-0074897) listing cited references KR 1999-37169 and KR 2000-76954.

\* cited by examiner

FLAT PANEL DISPLAY

CROSS-REFERENCE TO RELATED APPLICATION

This application claims priority to and the benefit of Korean Patent Application No. 2003-84786, filed Nov. 27, 2003, the disclosure of which is incorporated herein by reference in its entirety.

BACKGROUND OF THE INVENTION

1. Field of the Invention

The present invention relates to a flat panel display and, more particularly, to a full color active matrix organic light emitting display (AMOLED), which lowers taper angles of an anode and a via hole to prevent defects from occurring.

2. Description of the Related Art

In general, AMOLED has a plurality of pixels arranged on a substrate in a matrix format, and each pixel includes an electroluminescent (EL) element with an anode, an organic emission layer, and a cathode that are layered together. The AMOLED also includes a thin film transistor (TFT) connected to the EL element as an active element for driving the EL element.

FIG. 1 is a cross-sectional view of a bottom-emitting organic light emitting display (OLED) in accordance with the prior art. Referring to FIG. 1, a buffer layer 105 is formed on an insulating substrate 100, and a semiconductor layer 110 having source and drain regions 111 and 115 is formed on the buffer layer 105. A gate electrode 125 is formed on a gate insulating layer 120, and source and drain electrodes 141 and 145 are formed on an interlayer insulating layer 130, and are connected to the source and drain regions 111 and 115 through contact holes 131 and 135, respectively. This way, the TFT is fabricated.

An anode 170 as a lower electrode is formed on a passivation layer 150, and is connected through a via hole 155 to the drain electrode 145 of the source and drain electrodes 141 and 145. An organic emission layer 185 and a cathode 190 as an upper electrode are formed on the substrate. In this manner, the organic EL element is fabricated.

In the conventional organic light emitting display having the above-mentioned structure, when taper angles θ11 and θ12 of the contact holes or via hole are large, pin hole defects have occurred at stepped portions of the anode 170 and near the contact hole or via hole, or open circuit defects between the anode and the cathode have occurred. In addition, the organic emission layer has not been deposited on the stepped portions of the anode and near the contact hole and via hole, or it has not been uniformly deposited to thereby have a thickness thinner than those of other portions. Thus, when a high voltage is applied between the anode and the cathode, the portion where the organic emission layer is not deposited or thinly deposited has current density concentrated to generate circular dark spots. Due to the occurrence of the dark spots, emission regions become reduced to thereby deteriorate image quality.

In addition, the cathode to be deposited over the entire surface of the substrate is not densely formed in the stepped portion, which causes external oxygen or moisture to penetrate through the portion that is not densely formed. Thus, when a high voltage is applied between the anode and the cathode, the portion that is not densely deposited has a void in the cathode due to electromigration resulting from the current density concentration, so that high heat occurs due to a resistance increase resulting from external oxygen penetration. As a result, the portion has circular dark spots generated as time proceeds.

FIG. 4 is a cross-sectional photograph near a contact hole for indicating the deterioration mechanism resulting from a high taper angle of the contact hole or via hole in the conventional OLED. Referring to FIG. 4, oxygen or moisture penetrates through the open portion of the cathode 190 resulting from pin hole defects near the contact hole or via hole, so that the deterioration may be diffused.

FIG. 5 is a graph for explaining a relationship between the number of defects and taper angles of a contact hole or via hole in the conventional OLED. Referring to FIG. 5, it can be seen that the defects near the contact hole or via hole may be prevented when the taper angle of the contact hole or via hole is 60° or less. FIG. 6 is a photograph that shows occurrences of dark spots at the edge portion of the emission region when the taper angle of the contact hole or via hole is large. Referring to FIG. 6, it can be seen that a lot of dark spots generate near the edge portion of the emission region when the taper angle of the contact hole or via hole is 75°. In this case, the reference numerals 61 and 62 indicate dark spots occurred near via hole and the contact hole, respectively.

U.S. Pat. No. 5,684,365 discloses a technique, which limits a taper angle of a passivation layer at an edge of an opening for exposing some portions of an anode. FIG. 2 is a cross-sectional view of the conventional bottom-emitting OLED. Referring to FIG. 2, a buffer layer 205 is formed on an insulating substrate 200, and a semiconductor layer 210 having source and drain regions 211 and 215 is formed on the buffer layer 205. A gate electrode 225 is formed on a gate insulating layer 220, and source and drain electrodes 241 and 245 are formed on an interlayer insulating layer 230, and are connected to the source and drain regions 211 and 215 through contact holes 231 and 235, respectively. Further, an anode 270 as a lower electrode is formed on the interlayer insulating layer 230, and is connected to the drain electrode 245.

A passivation layer 250 formed of an insulating layer such as a silicon nitride layer is deposited to have a 0.5 to 1.0 µm in thickness on the substrate, and is etched to form an opening 275 for exposing some portions of the anode 270. In this case, the passivation layer 250 is arranged at the edge of the opening 275 to have a taper angle θ21 of 10° to 30° with respect to the anode 270. An organic emission layer 285 and a cathode 290 as an upper electrode are then formed on the substrate.

In the conventional flat panel display having the above-mentioned structure, the taper angle θ21 of the passivation layer contacted with the anode is limited to be in a range of 10° to 30° when the passivation is etched to expose some portions of the anode so as to prevent defects of the organic emission layer from occurring. However, pin hole or open circuit defects still generate near the contact hole, the via hole, or in the stepped portion as shown in FIG. 4 and FIG. 5, and dark spots are also generated due to the cathode that is not densely deposited.

In addition, U.S. Pat. No. 6,246,179 discloses a technique employing an organic insulating layer with planarizing property to prevent defects from occurring near the via hole, contact hole, or in the stepped portion. FIG. 3 is a cross-sectional view of the OLED having the conventional top-emitting structure. Referring to FIG. 3, a buffer layer 305 is formed on an insulating layer 300, and a semiconductor layer 310 having source and drain regions 311 and 315 is formed on the buffer layer 305. A gate electrode 325 is formed on a gate insulating layer 320, and source and drain electrodes 341 and 345 are formed on the interlayer insulating layer 330, and are connected to the source and drain regions 311 and 315 through contact holes 331 and 335, respectively.

A planarizing layer 360 is formed on a passivation 350, and an anode 370 as a lower electrode is formed on the planarizing layer 360, and is connected through a via hole 355 to one of the source and drain electrodes 341 and 345, for example, to the drain electrode 345. A pixel defining layer 365 is then formed to have an opening 375 for exposing some portions of the anode 370, and an organic emission layer 385 and a cathode 390 as an upper electrode are formed on the anode 370 and the pixel defining layer 365.

In the above-mentioned OLED, a taper angle θ31 of the pixel defining layer is limited in a range of 20° to 80° to prevent defects of the organic emission layer, and the planarizing layer is used for preventing element defects from occurring near the contact hole or via hole due to the stepped portion of the substrate surface. However, reliability of the element is dependent on the taper angle between the pixel defining layer and the anode. By way of example, the organic emission layer and the cathode are likely to be deteriorated at the edge of the opening when the taper angle is large, and there is a limit to reducing the taper angle and the thickness of the pixel defining layer because of a parasitic capacitance and a step resulting from wiring when the taper angle is small.

Further, an aperture ratio is further decreased with the increasing use of the pixel defining layer, and outgas from the pixel defining layer causes the emission region to be reduced, which leads to pixel size reduction, so that lifetime and image quality are deteriorated, and additional processes for depositing and etching the pixel defining layer are required.

SUMMARY OF THE INVENTION

In an exemplary embodiment according to the present invention, a flat panel display capable of preventing defects from occurring by decreasing a taper angle at an edge of an anode, is provided.

In another exemplary embodiment according to the present invention, a flat panel display capable of preventing defects from occurring by decreasing taper angles of a contact hole and a via hole, is provided.

In yet another exemplary embodiment according to the present invention, a flat panel display capable of increasing an aperture ratio, is provided.

In yet another exemplary embodiment according to the present invention, a flat panel display capable of lengthening the lifetime and increasing the image quality, is provided.

According to an aspect of the present invention, there is provided a flat panel display, which includes an insulating substrate, a lower conductive layer formed on the insulating substrate, an upper conductive layer formed above the lower conductive layer, and an insulating layer formed between the upper conductive layer and the lower conductive layer. The insulating layer has an interconnecting hole used for interconnecting the upper conductive layer and the lower conductive layer. The interconnecting hole is tapered with a taper angle of 60° or less with respect to a surface of the insulating substrate.

The interconnecting hole may have a taper angle in a range of 14° to 45°. The lower conductive layer may include source and drain regions of a thin film transistor, the upper conductive layer may include source/drain electrodes, and the interconnecting hole may include contact holes used for connecting the source and drain regions to the source and drain electrodes, respectively. The lower conductive layer may be one of a source electrode and a drain electrode of a thin film transistor, the upper conductive layer may be an anode, and the interconnecting hole may be a via hole used for connecting said one of the source electrode and the drain electrode of the thin film transistor to the anode.

According to another aspect of the present invention, there is provided a thin film transistor, which includes a semiconductor layer having a source region and a drain region formed on an insulating substrate. A gate electrode is formed above the semiconductor layer, a source electrode is connected to the source region of the semiconductor layer, and a drain electrode is connected to the drain region of the semiconductor layer. A gate insulating layer is formed between the semiconductor layer and the gate electrode, and an interlayer insulating layer is formed between the source and drain electrodes and the gate electrode. The gate insulating layer and the interlayer insulating layer have contact holes for connecting the source and drain regions to the source and drain electrodes, respectively. Each said contact hole is tapered with a taper angle of 60° or less with respect to a surface of the insulating substrate.

The taper angle may be 45° or less. A minimum value of the taper angle of each said contact hole may be determined by the equation $\theta = \tan^{-1}(d1/d2)$, wherein d1 is a horizontal distance, from a position on one of the source and drain electrodes where a distance between said one of the source and drain electrodes and the gate electrode is minimum, to a bottom edge of a corresponding said contact hole, and d2 is a sum of thicknesses of the gate insulating layer and the interlayer insulating layer at the position on said one of the source and drain electrodes where the distance between said one of the source and drain electrodes and the gate electrode is minimum.

According to yet another aspect of the present invention, there is provided a flat panel display, which includes a thin film transistor having at least source and drain electrodes formed on an insulating substrate, an insulating layer having a via hole for exposing one of the source and drain electrodes, and an anode connected to said one of the source and drain electrodes through the via hole. The via hole is tapered with a taper angle of 60° or less with respect to a surface of the insulating substrate, and the anode is tapered with a taper angle of 60° or less with respect to the surface of the insulating substrate.

The taper angle of the via hole may be 45° or less, and the taper angle of the anode may be 45° or less. A minimum value of the taper angle of the anode may be determined by the equation $\theta = \tan^{-1}(d1/d2)$, wherein d1 is the thickness of the anode, and wherein d2 is a difference between a length of a lower surface of the anode and length of an upper surface of the anode.

According to yet another aspect of the present invention, there is provided a flat panel display, which includes a lower electrode formed on an insulating substrate, an organic emission layer formed on the lower electrode, and an upper electrode formed on the organic emission layer. The lower electrode is tapered with a taper angle of 60° or less with respect to a surface of the insulating substrate, and a minimum value of the taper angle of the lower electrode is determined by the equation $\theta = \tan^{-1}(d1/d2)$, wherein d1 is a thickness of the lower electrode, and d2 is a difference between a length a lower surface of the lower electrode and a length of an upper surface of the lower electrode.

The lower electrode may be one of an anode and a cathode, and the upper electrode may be the other one of the anode and the cathode. Alternatively, the lower electrode may be a transmitting electrode, and the upper electrode may be a reflective electrode, and light emitted from the organic emission layer may be directed toward the substrate. Alternatively, the lower electrode may be a reflective electrode, and the upper electrode may be a transmitting electrode, and light emitted from the organic emission layer may be directed in a direction opposite to the substrate. Alternatively, the lower electrode and the upper electrode may be transmitting electrodes, and light emitted from the organic emission layer may be directed both toward the substrate and in a direction opposite to the substrate.

The organic emission layer may include at least one thin layer selected from a hole injecting layer, a hole transporting layer, an emission layer, a hole blocking layer, an electron transporting layer, and an electron injecting layer. The organic emission layer may be formed by a laser induced thermal imaging method, an inkjet printing method, or a deposition method.

According to yet another aspect of the present invention, there is provided a flat panel display, which includes an insulating substrate, and a semiconductor layer having source and drain regions of a thin film transistor formed on the insulating substrate, and a first insulating layer having contact holes for exposing a portion of the source region and a portion of the drain region. Source and drain electrodes are connected respectively to the source and drain regions through the contact holes. A second insulating layer is formed on the first insulating layer and has a via hole for exposing one of the source and drain electrodes. A lower electrode is formed on the second insulating layer and is connected to said one of the source and drain electrodes of the thin film transistor through the via hole. An organic emission layer is formed on the lower electrode, and an upper electrode is formed on the organic emission layer. The via hole is tapered with a taper angle of 60° or less with respect to the surface of the insulating substrate, and the lower electrode is tapered with a taper angle of 60° or less with respect to the surface of the insulating substrate.

According to yet another aspect of the present invention, there is provided a flat panel display, which includes an insulating substrate, a semiconductor layer having source and drain regions of a thin film transistor formed on the insulating substrate, and a gate electrode formed over the semiconductor layer. A first insulating layer is formed between the semiconductor layer and the gate electrode. A second insulating layer has contact holes for exposing a portion of the source region and a portion of the drain region, and source and drain electrodes are connected respectively to the source and drain regions through the contact holes. A third insulating layer formed on the second insulating layer has a via hole for exposing one of the source and drain electrodes. A lower electrode is formed on the third insulating layer and is connected to said one of the source and drain electrodes of the thin film transistor through the via hole. An organic emission layer is formed on the lower electrode, and an upper electrode is formed on the organic emission layer. The via hole and the contact holes are tapered with taper angles of 60° or less with respect to a surface of the insulating substrate, and the lower electrode is tapered with a taper angle of 60° or less with respect to the surface of the insulating substrate.

According to yet another aspect of the present invention, there is provided a flat panel display, which includes an insulating substrate, a semiconductor layer having source and drain regions of a thin film transistor formed on the insulating substrate, and a gate electrode formed above the semiconductor layer. A first insulating layer is formed between the semiconductor layer and the gate electrode. A second insulating layer has contact holes for exposing a portion of the source region and a portion of the drain region. Source and drain electrodes are connected respectively to the source and drain regions through the contact holes. A lower electrode is formed on the second insulating layer and connected to one of the source and drain electrodes. A third insulating layer for passivation has an opening for exposing a portion of the lower electrode. An organic emission layer is formed on the lower electrode and the third insulating layer, and an upper electrode is formed on the organic emission layer. The contact holes and the lower electrode are tapered with taper angles of 60° or less with respect to a surface of the insulating substrate.

BRIEF DESCRIPTION OF THE DRAWINGS

The above and other features of the present invention will become more apparent to those of ordinary skill in the art by describing in detail certain exemplary embodiments thereof with reference to the attached drawings in which.

DETAILED DESCRIPTION

Figure 1:
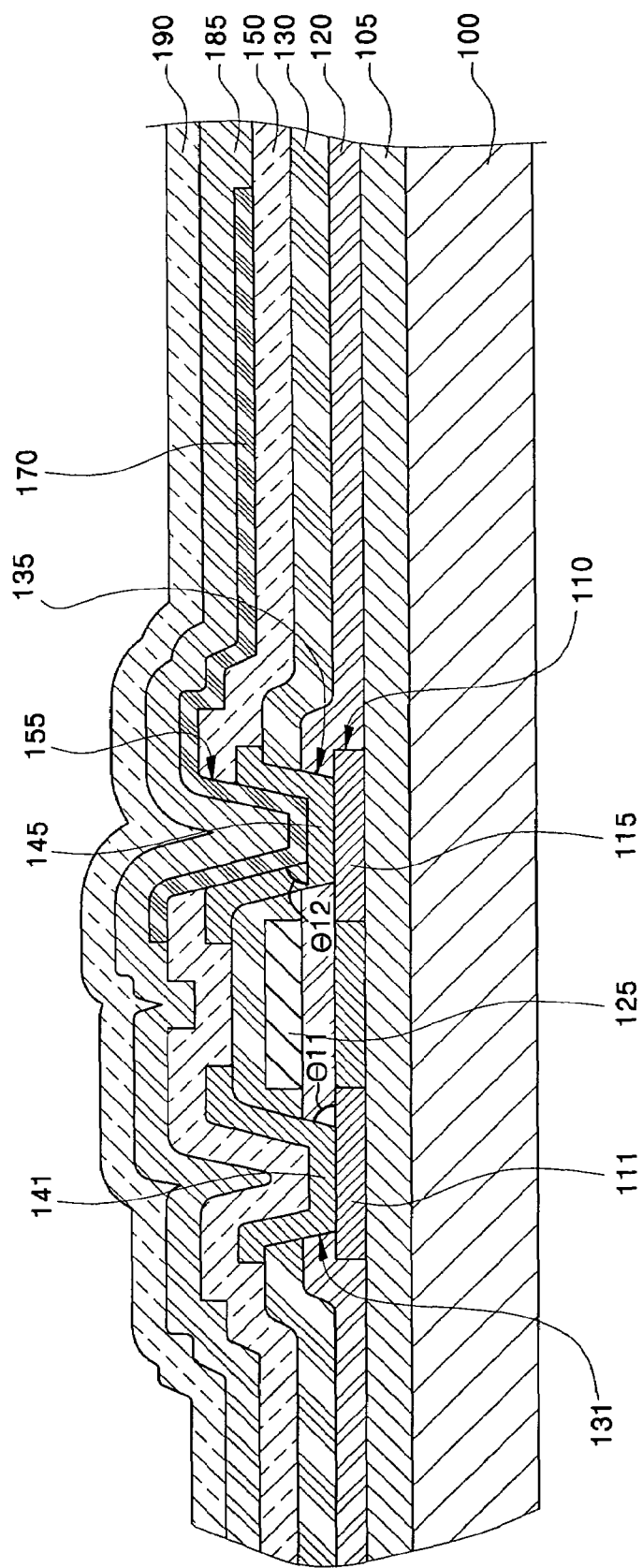
FIG. 1 is a cross-sectional view of an organic light emitting display (OLED) in accordance with the prior art.
Figure 2:
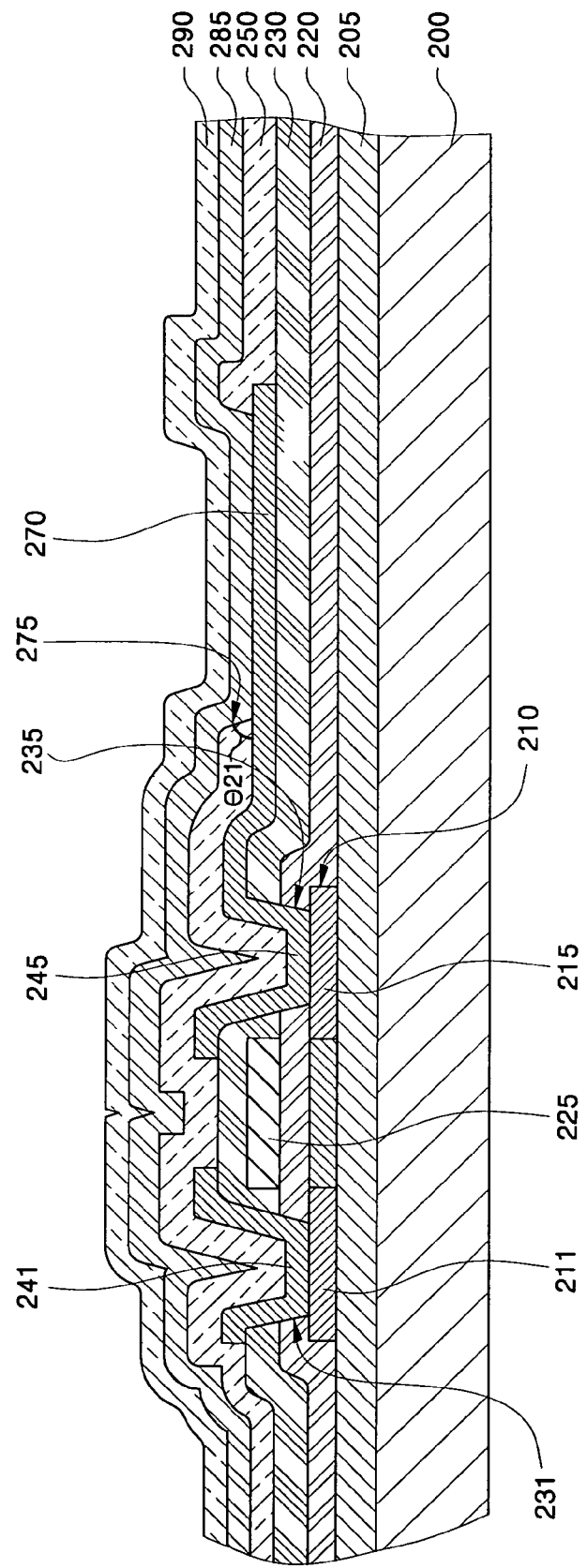
FIG. 2 is a cross-sectional view of an OLED having a tapered passivation layer in accordance with the prior art.
Figure 3:
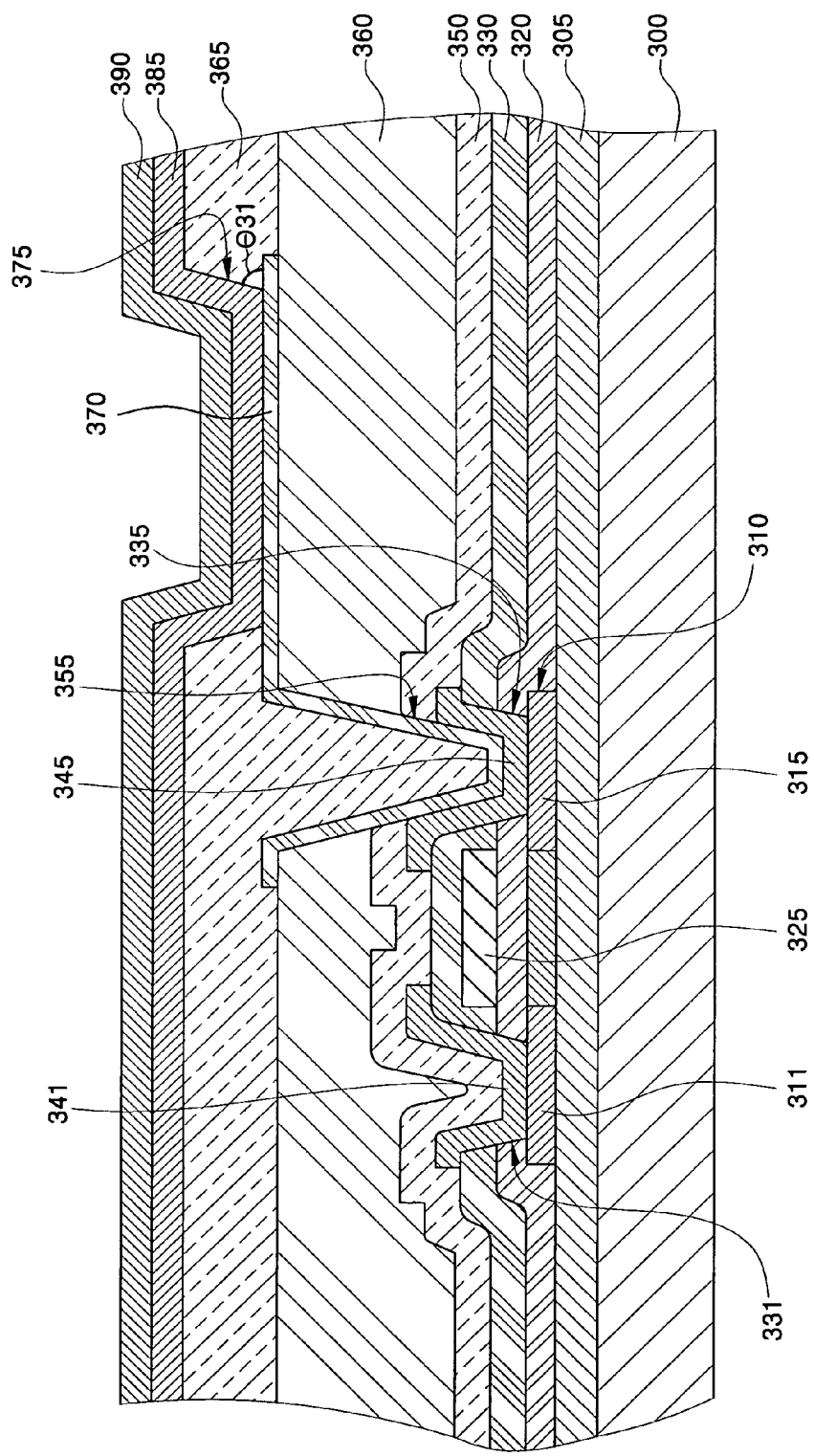
FIG. 3 is a cross-sectional view of an OLED having a pixel isolation layer in accordance with the prior art.
Figure 4:
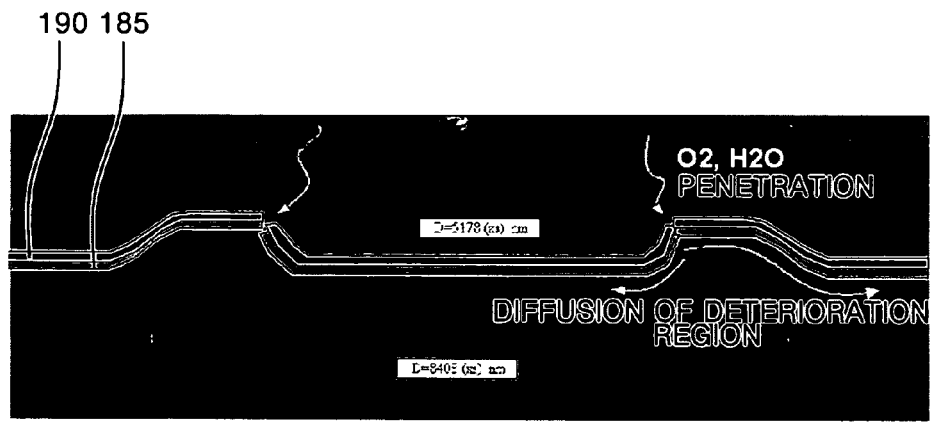
FIG. 4 is a photograph showing occurrences of defects due to an open circuit of a cathode in a conventional OLED.

The present invention will now be described more fully hereinafter with reference to the accompanying drawings, in which certain exemplary embodiments of the present invention are shown. This invention may, however, be embodied in different forms and should not be construed as being limited to the embodiments set forth herein. In the drawings, the thickness of layers and regions are exaggerated for clarity. Like reference numerals/characters designate like elements throughout the specification and the drawings.

Figure 7:
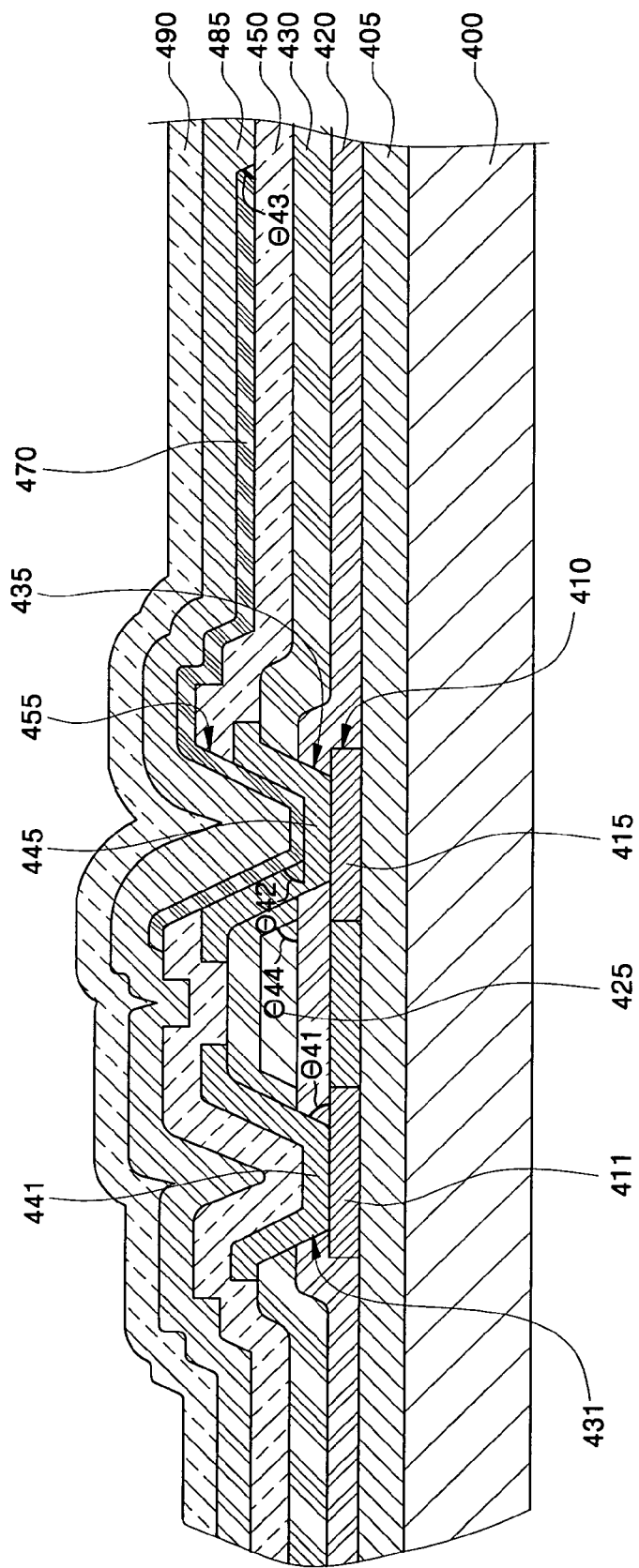
FIG. 7 is a cross-sectional view of an OLED in accordance with a first exemplary embodiment of the present invention.

Referring to FIG. 7, a buffer layer 405 is formed on an insulating substrate 400, and a semiconductor layer 410 having source and drain regions 411 and 415 is formed on the buffer layer 405. A gate electrode 425 is formed on the gate insulating layer 420, and source and drain electrodes 441 and 445 are formed on an interlayer insulating layer 430, and are connected to the source and drain regions 411 and 415 through contact holes 431 and 435, respectively.

In this and other exemplary embodiments, one or more layers and/or elements may be referred to as formed on or being on the insulating substrate even though there may be intervening layers/elements between the insulating substrate and said layers and/or elements. By way of example, The semiconductor layer 410 may be referred to as being formed on the insulating substrate 400 even though the buffer layer 405 is disposed therebetween.

An anode 470 as a lower electrode is formed on a passivation layer 450, and is connected through a via hole 455 to one of the source and drain electrodes 441 and 445, for example, to the drain electrode 445. After the anode 470 is formed, an organic emission layer 485 and a cathode 490 are sequentially formed. The organic emission layer 485 includes at least one thin layer selected from a hole injecting layer, a hole transporting layer, an R, G, or B emission layer, a hole blocking layer, an electron transporting layer, and an electron injecting layer.

To prevent element defects in the contact hole and via hole from occurring, in the first exemplary embodiment of the present invention, the interlayer insulating layer 430 and the gate insulating layer 420 are etched to form the contact holes 431 and 435 having a first taper angle θ41, and the passivation layer 450 is etched to form the via hole 455 having a second taper angle θ42.

Figure 5:
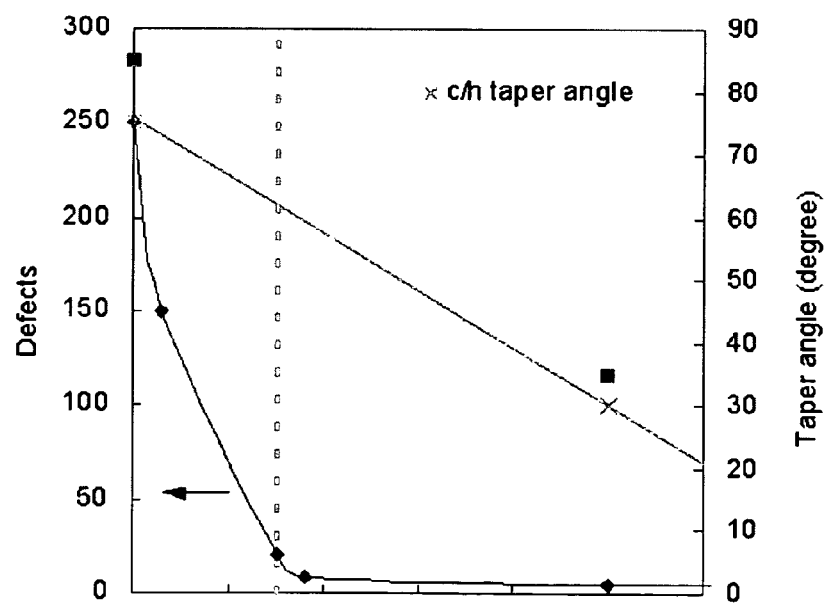
FIG. 5 is a graph illustrating a relationship between the number of defects and taper angles of a contact hole or via hole in a conventional OLED.
Figure 6:
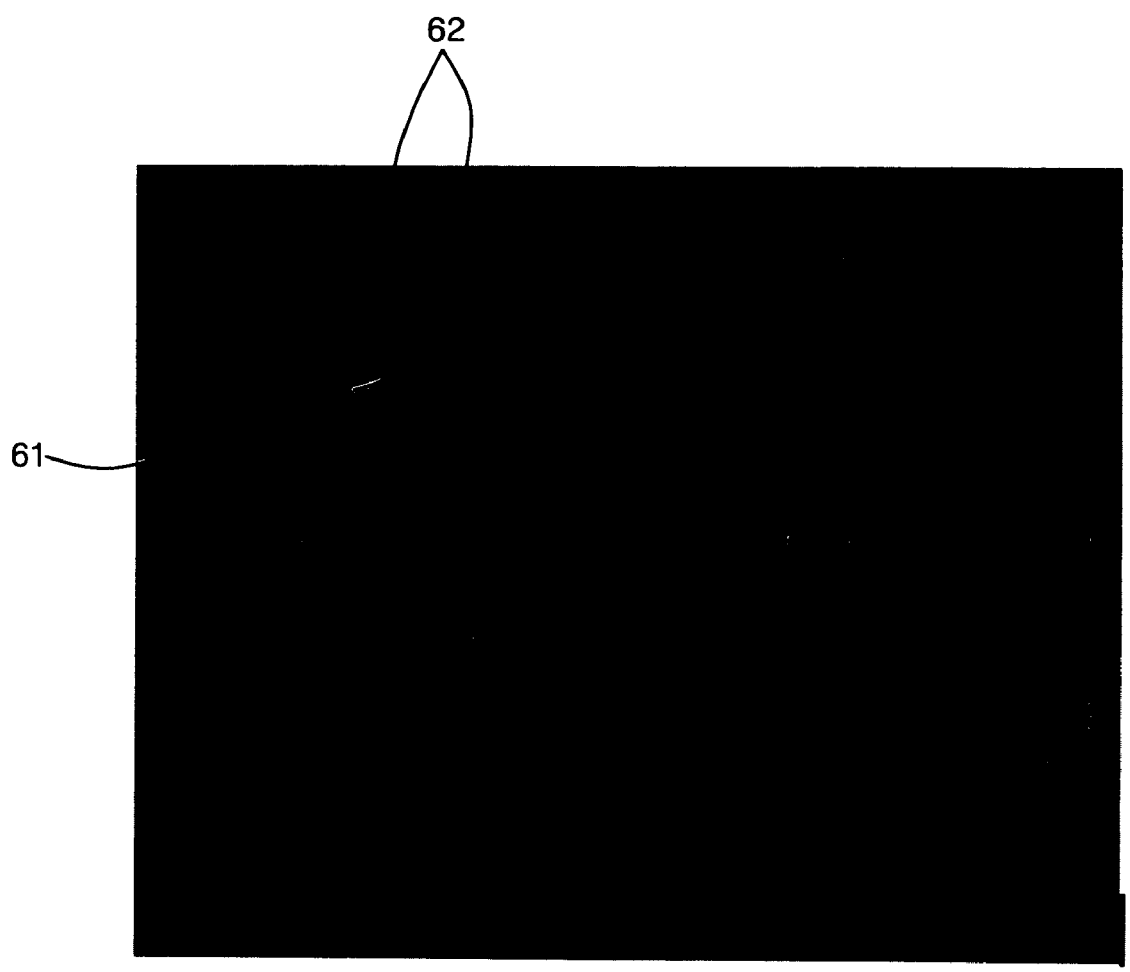
FIG. 6 is a photograph which illustrates dark spots near a contact hole and a via hole among emission regions in a conventional OLED.

The first taper angle θ41 of the contact holes 431 and 435 refers to an angle formed by sides of the contact holes 431 and 435 with respect to the substrate surface, and the second taper angle θ42 refers to an angle formed by the side of the via hole 455 with respect to the substrate surface. The contact holes 431 and 435 and the via hole 455 should have the first and second taper angles θ41 and θ42 of 60° or less, respectively, so as to prevent the defects from occurring as shown in FIG. 5. Preferably, the contact holes 431 and 435 and the via hole 455 should have taper angles of 45° or less.

The contact holes 431 and 435 are used to connect upper conductive layers to lower conductive layers. By way of example, the contact holes 431 and 435 are used respectively to connect the source and drain electrodes 441 and 445 to the source and drain regions 411 and 415 formed on the semiconductor layer 410, and the source and drain electrodes 441 and 445 are formed adjacent to the gate electrode 425. Thus, the gate electrode 425 and the source and drain electrodes 441 and 445 should be arranged to be spaced from each other by a predetermined distance in order to minimize the interference between the gate electrode 425 and the source and drain electrodes 441 and 445. Thus, the first taper angle θ41 should maintain an angle not less than a predetermined value.

Figure 8A:
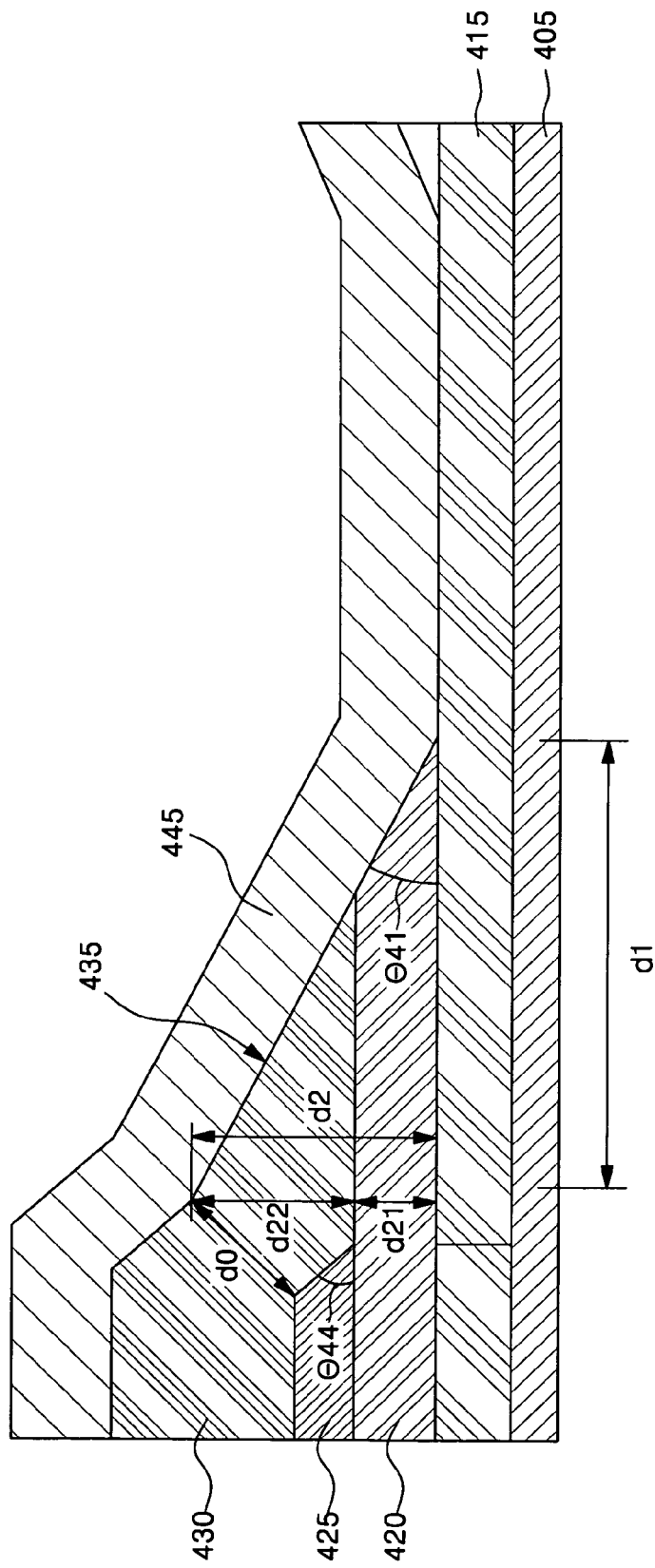
FIG. 8A explains the principle how the minimum taper angle for a contact hole is determined in an OLED in accordance with the first exemplary embodiment of the present invention.

FIG. 8A shows the contact hole 435 for connecting the drain electrode 445 to the drain region 415 among the contact holes 431 and 435 of FIG. 7.

Referring to FIG. 8A, a minimum distance between the gate electrode 425 and the drain electrode 445 is defined as d0, and a horizontal distance from the position where the d0 is minimum to the bottom edge of the contact hole is defined as d1. Further, the sum of the thickness d22 of the interlayer insulating layer 430 and the thickness d21 of the gate insulating layer 420, which is the thickness of insulating layers, at a position where the distance d0 between the gate electrode 425 and the drain electrode 445 is minimum, is defined as d2. Thus, to prevent the interference between the gate electrode 425 and the drain electrode 445, the gate electrode 425 and the drain electrode 445 have to maintain the distance d0. Because of this, the contact hole 435 should have a taper angle for maintaining the minimum distance between the gate electrode 425 and the drain electrode 445.

As a result, the first taper angle θ41 for maintaining the minimum distance between the gate electrode 425 and the drain electrode 445 is given from a first equation 1 below.

$$\tan \theta 41 = d2/d1$$

$$\theta 41 = \tan^{-1}(d2/d1) \quad (1)$$

In the OLED having high resolution, d1 is 2 μm based on the design rule, and when the thickness d21 of the gate insulating layer 420 is 0.1 μm and the thickness d22 of the interlayer insulating layer 430 is 0.4 μm, the minimum value of the first taper angle is given from the first equation.

In other words, $\tan \theta 41 = 0.5 \mu m/2 \mu m$, $\theta 41 = \tan^{-1}(0.25) = 14°$.

Therefore, the first taper angle θ41 in the first exemplary embodiment of the present invention should be in a range of 14° to 60°. In addition, to minimize the interference between the gate electrode and the source and drain electrodes, the gate electrode 425 should have a predetermined fourth taper angle θ44. The fourth taper angle θ44 is formed between the side of the gate electrode and the substrate surface, and should be the same angle as a third taper angle θ43. Thus, the fourth taper angle θ44 should be 60° or less, and preferably, in a range of 14° to 45°. The gate electrode 425 is formed to have the fourth taper angle θ44 using a taper-etching method after gate electrode material is deposited.

The anode 470 should have a predetermined third taper angle θ43 to prevent element defects from occurring at an edge of the anode in the first exemplary embodiment of the present invention. The third taper angle θ43 is formed between the side of the anode and the substrate surface, and the anode as a lower electrode is patterned to have the third taper angle θ43 when anode material is deposited and patterned. The third taper angle θ43 should be 60° or less, and preferably, 45° or less.

Figure 8B:
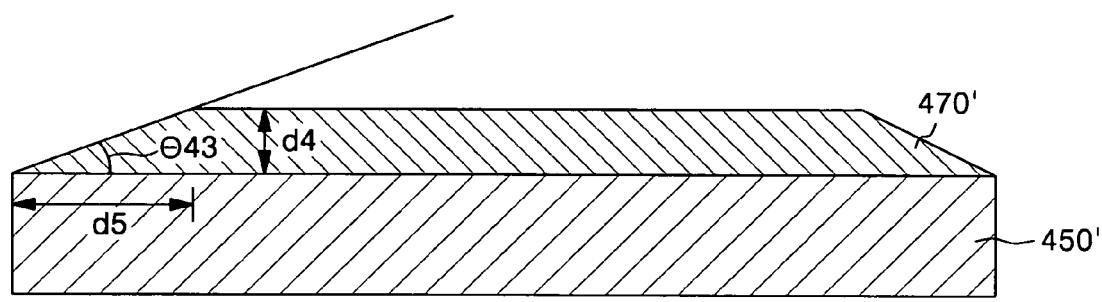
FIG. 8B explains the principle how the minimum taper angle for an anode is determined in an OLED in accordance with the first exemplary embodiment of the present invention.

The structure of OLED illustrated in FIG. 8B does not correspond exactly to the structure of the OLED shown in FIG. 7. Instead, FIG. 8B provides a view for explaining a principle of obtaining the minimum taper angle of an anode 470' in the OLED in accordance with the first exemplary embodiment of the present invention. The taper angle θ43 for the anode 470 in FIG. 7 is calculated using the same principle as illustrated in FIG. 8B.

Referring to FIG. 8B, when an anode 470' as a lower electrode formed on a passivation layer 450' has a thickness of d4 and a length difference between an upper surface and a lower surface of the anode 470' having the predetermined third taper angle θ43 is d5, the taper angle of the lower electrode is given by the equation 2 below.

$$\tan \theta 43 = d4/d5$$

$$\theta 43 = \tan^{-1}(d4/d5) \quad (2)$$

For example, when the thickness d4 of the lower electrode is 0.1 μm, and when the length difference d5 between the upper surface and the lower surface of the anode 470' is 2 μm or less based on the design rule, the minimum value of the third taper angle θ43 is obtained from the equation 2.

In other words, tan θ43=0.1 μm/2 μm, and θ43=tan$^{-1}$(0.05) =2.9°.

Thus, the anode 470' should have the third taper angle in a range of 2.9° to 60° in the first exemplary embodiment of the present invention.

Figure 14:
FIG. 14 is a photograph of a normal emission region when the taper angle of a contact hole or via hole is 60° or less in an OLED in accordance with an exemplary embodiment of the present invention.

When taper angles of the contact holes and the via hole are reduced to be 60° or less and the taper angle of the lower electrode is reduced to be 60° or less as is done in the first exemplary embodiment, dark spots do not occur in the emission region as shown in FIG. 14.

Figure 9:
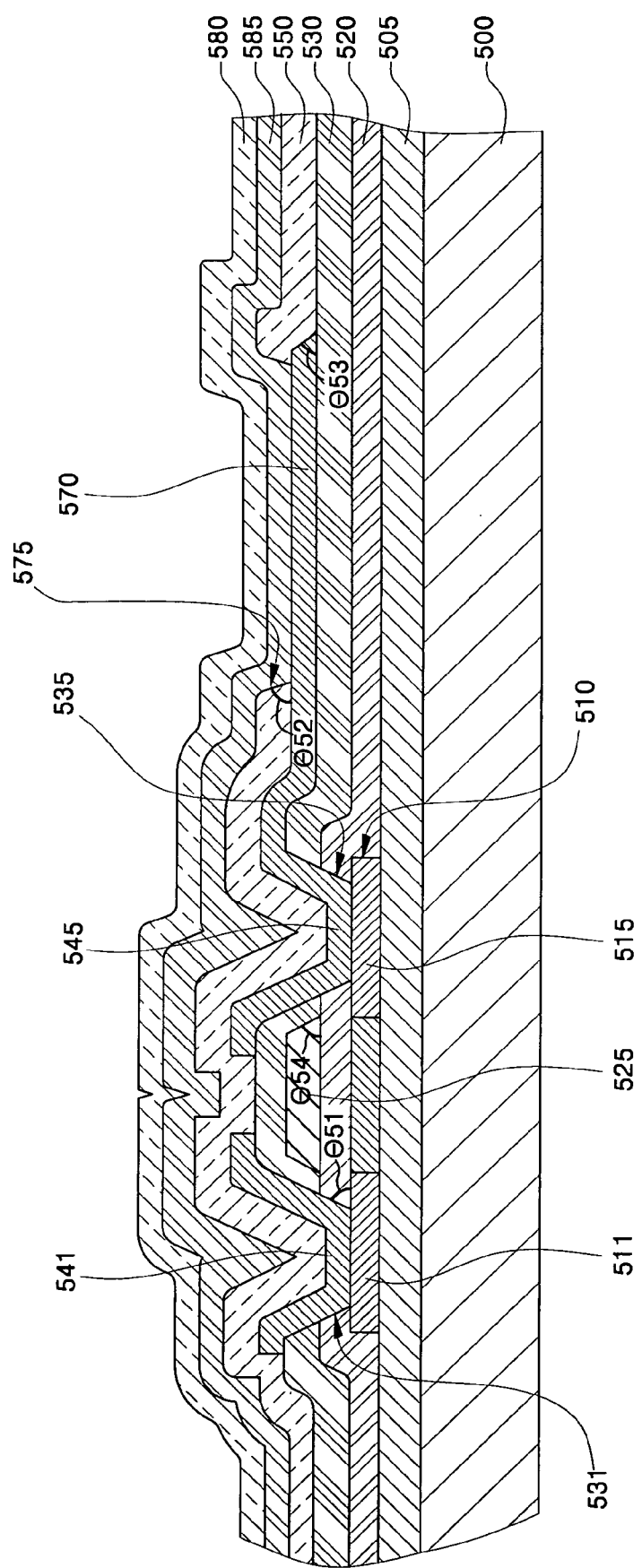
FIG. 9 is a cross-sectional view of an OLED in accordance with a second exemplary embodiment of the present invention.

Referring to FIG. 9, a buffer layer 505 is formed on an insulating substrate 500, and a semiconductor layer 510 having source and drain regions 511 and 515 is formed on the buffer layer 505. A gate electrode 525 is formed on a gate insulating layer 520, and source and drain electrodes 541 and 545 are formed on an interlayer insulating layer 530, and are connected through contact holes 531 and 535 to the source and drain regions 511 and 515, respectively. An anode 570 as a lower electrode is formed on the interlayer insulating layer 530, and is connected to one of the source and drain electrodes 541 and 545, for example, to the drain electrode 545.

The contact holes 531 and 535 should have a first taper angle θ51 in a range of 14° to 60°, and preferably in a range of 14° to 45°. The gate electrode 525 has the same fourth taper angle θ54 as the contact holes 531 and 535, and should have the fourth taper angle θ54 in a range of 14° to 60°, and preferably in a range of 14° to 45°. The anode 570 should have a third taper angle θ53 in a range of 2.9° to 60°, and preferably in a range of 2.9° to 45°.

A passivation layer 550 is formed over the entire surface of the substrate, and has an opening 575 for exposing a portion of the anode 570. An organic emission layer 585 and a cathode 580 are formed on the passivation layer 550 and the anode 570 of the opening 575. The opening 575 formed in the passivation layer 550 should have a second taper angle θ52 of 40° or less. The organic emission layer 585 includes at least one thin layer selected from a hole injecting layer, a hole transporting layer, an R, G, or B emission layer, a hole blocking layer, an electron transporting layer, and an electron injecting layer.

Figure 10:
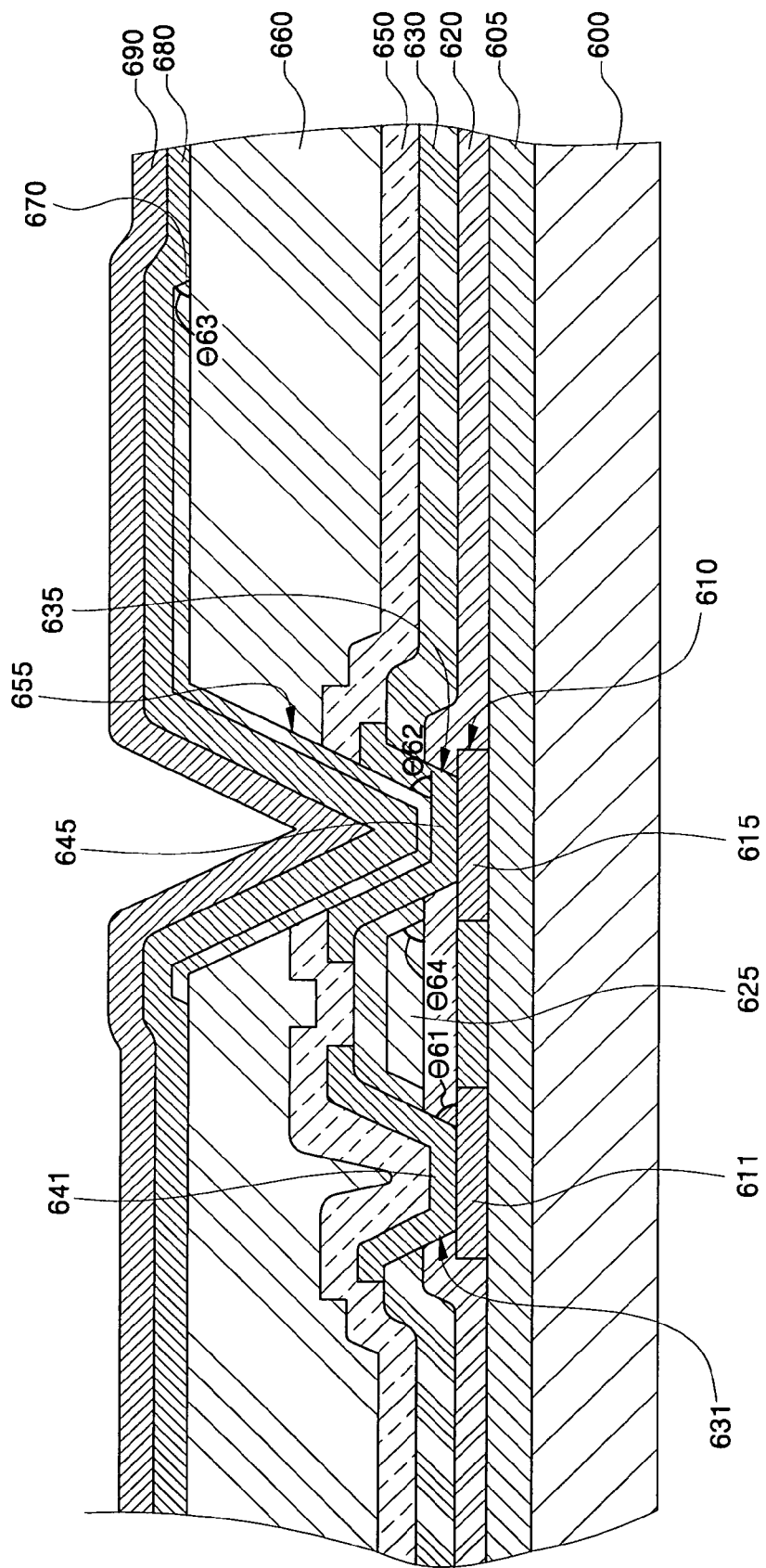
FIG. 10 is a cross-sectional view of an OLED in accordance with a third exemplary embodiment of the present invention.

Referring to FIG. 10, a buffer layer 605 is formed on an insulating substrate 600, and a semiconductor layer 610 having source and drain regions 611 and 615 is formed on the buffer layer 605. A gate electrode 625 is formed on a gate insulating layer 620, and source and drain electrodes 641 and 645 are formed on an interlayer insulating layer 630, and are connected to the source and drain regions 611 and 615, respectively, through contact holes 631 and 635.

A passivation layer 650 and a planarizing layer 660 are sequentially formed over the entire surface of the substrate. An anode 670 is formed on the planarizing layer 660, and is connected through a via hole 655 formed in the planarizing layer 660 and the passivation layer 650 to one of the source and drain electrodes 641 and 645, for example, to the drain electrode 645. An organic emission layer 685 and a cathode 690 are sequentially formed on the anode 670 and the planarizing layer 660. The organic emission layer 680 includes at least one thin layer selected from a hole injecting layer, a hole transporting layer, an R, G, or B emission layer, a hole blocking layer, an electron transporting layer, and an electron injecting layer.

The via hole 655 should have a second taper angle θ62 in a range of 14° to 60°, and preferably in a range of 14° to 45°. The anode 670 should have a third taper angle θ63 in a range of 2.9° to 60°, and preferably in a range of 2.9° to 45°.

In the OLED in accordance with the third exemplary embodiment of the present invention, since the planarizing layer 660 is formed to planarize the substrate surface before the anode is formed after the thin film transistor is formed, the contact holes 631 and 635 may be formed by the typical method or formed to allow a first taper angle θ61 to be in a range of 14° to 60° as is done in the first and second exemplary embodiments. In the same manner, the gate electrode 625 may be formed by the typical method or formed to allow a fourth taper angle θ64 to be in a range of 14° to 60° as is done in the first and second exemplary embodiments.

Figure 11A:
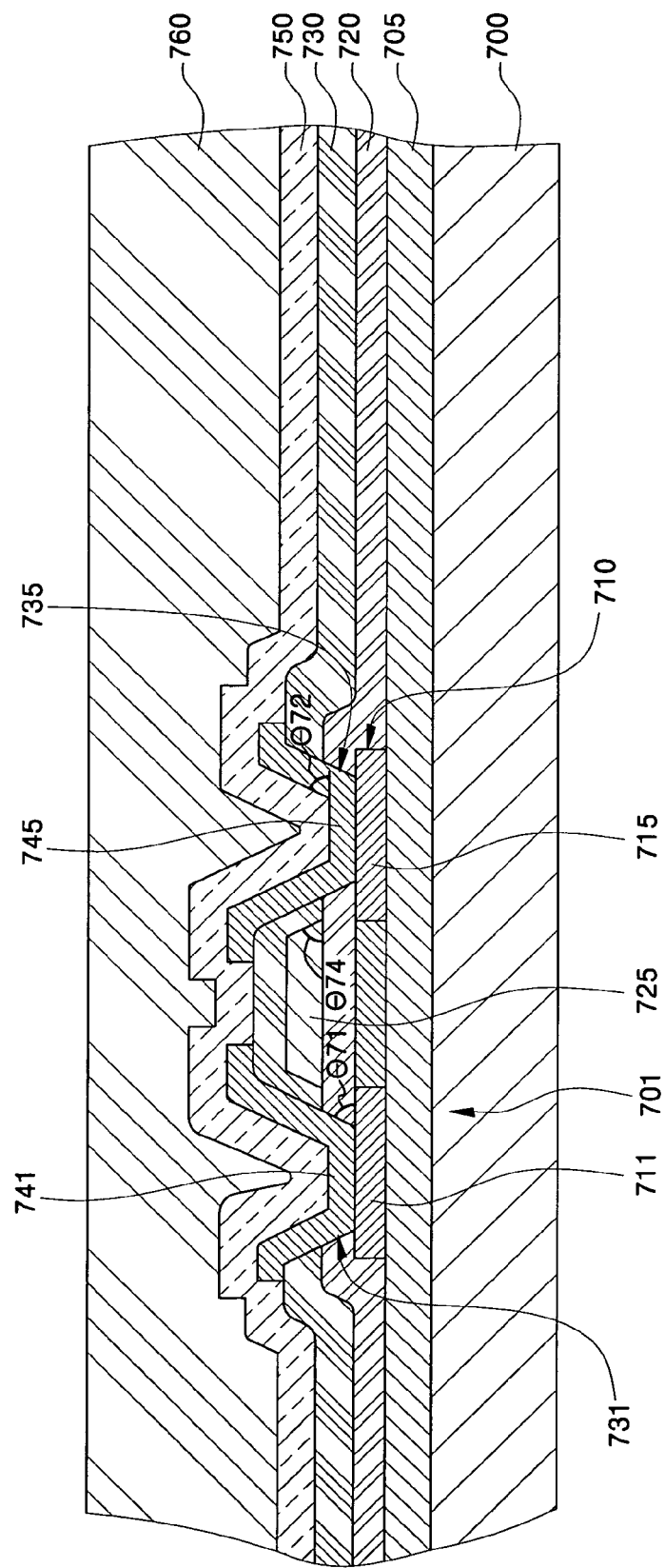
FIG. 11A and FIG. 11B are cross-sectional views which illustrate processes for a first method for fabricating an OLED in accordance with the third exemplary embodiment of the present invention.

Referring to FIG. 11A, a passivation layer 750 is deposited on an interlayer insulating layer 730, a gate insulating layer 720 and a buffer layer 705 formed on an insulating substrate 700 where a thin film transistor 701 is formed, and a planarizing layer 760 is deposited on the passivation layer 750. The thin film transistor 701 may be formed by a typical method or formed to allow a gate electrode 725 to have a predetermined fourth taper angle θ74 and to allow contact holes 731 and 735 to have a predetermined first taper angle θ71 as is done in the first and second exemplary embodiments. The taper angles θ71 and θ74 are substantially the same as the taper angles θ61 and θ64, respectively, of FIG. 10. The passivation layer 750 is an inorganic insulating layer, and a nitride layer may be used for the same. The planarizing layer is an organic insulating layer, and a BCB layer may be used for the same.

Figure 11B:
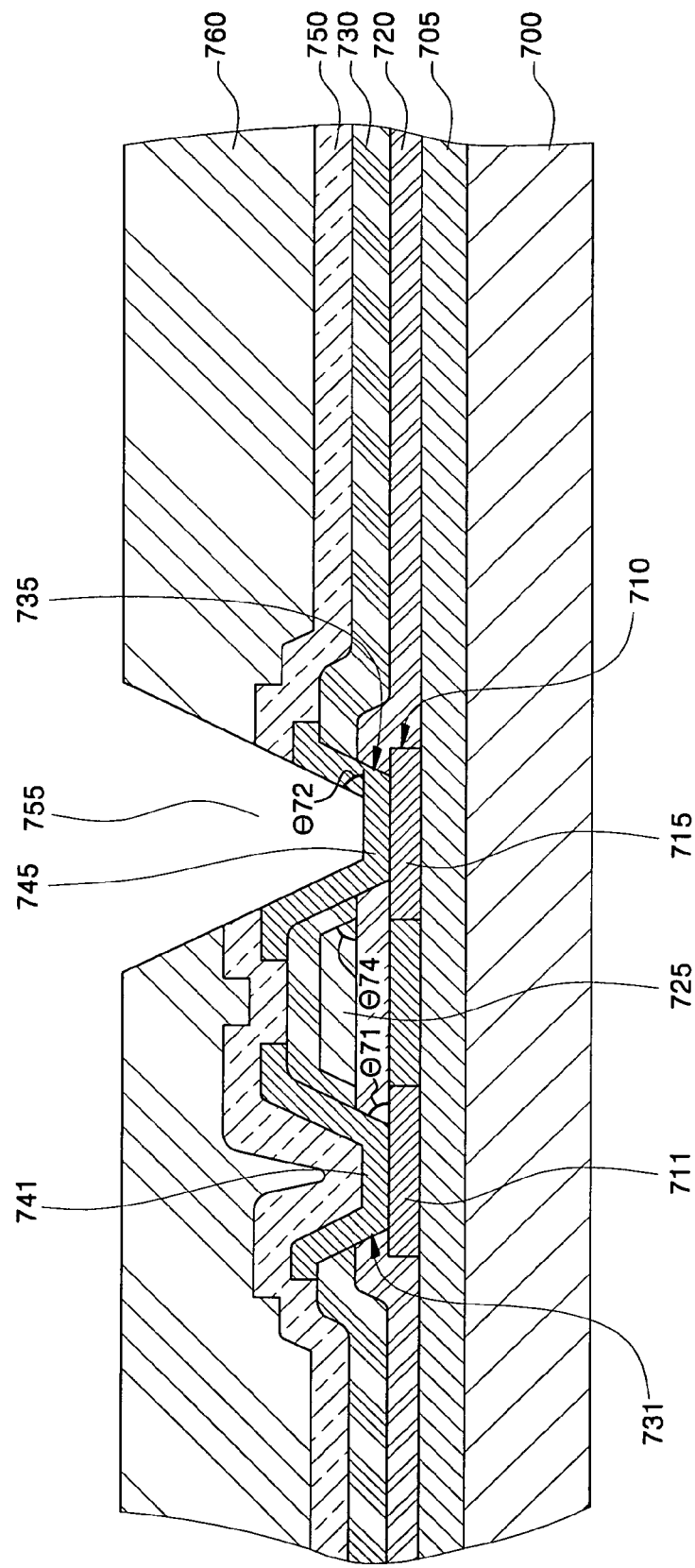

Referring to FIG. 11B, the passivation layer 750 and the planarizing layer 760 are dry etched at the same time to expose a drain electrode 745 among source and drain electrodes 741 and 745 of the thin film transistor 701, which leads to form a via hole 755 having a second taper angle θ72 of 60° or less, preferably 40° or less. The source and drain electrodes 741 and 745 are connected to source and drain regions 711 and 715 of a semiconductor layer 710 through the contact holes 731 and 735, respectively.

Next, an anode (not shown in FIG. 11B) connected to the drain electrode 745 through the via hole 755, an organic emission layer (not shown in FIG. 11B), and a cathode (not shown in FIG. 11B) are sequentially formed.

Figure 12A:
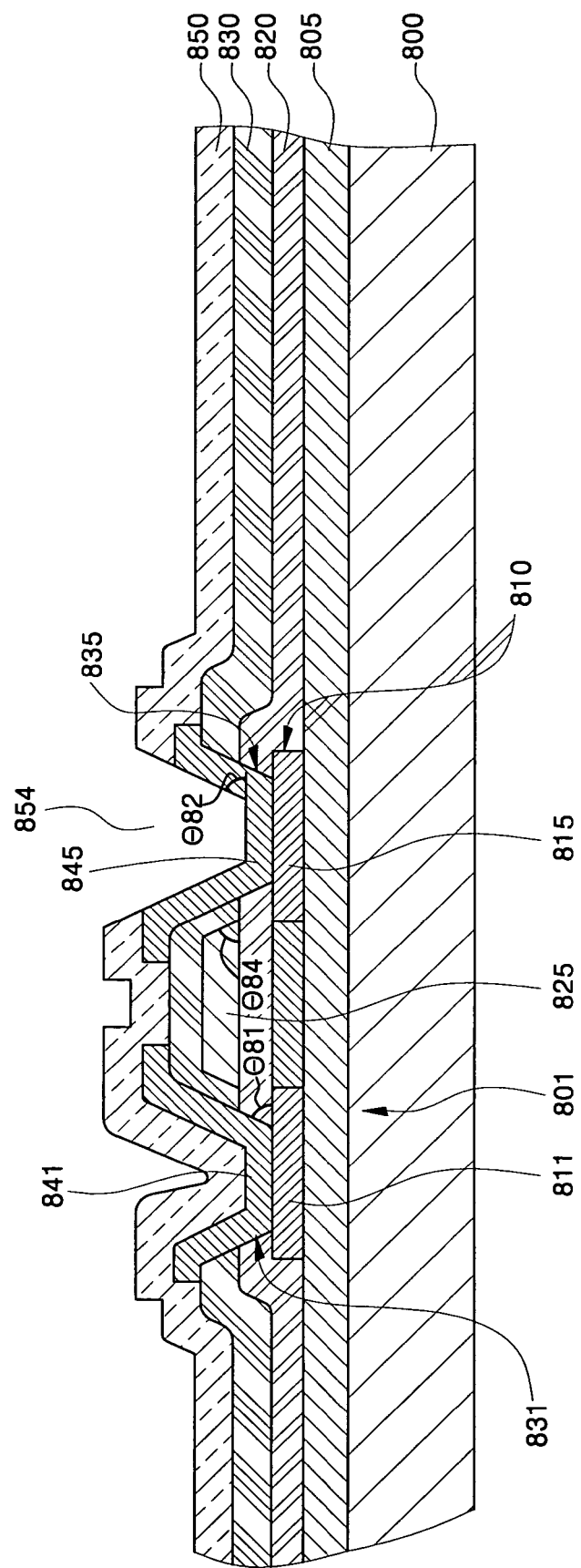
FIG. 12A and FIG. 12B are cross-sectional views which illustrate processes for a second method for fabricating an OLED in accordance with the third exemplary embodiment of the present invention.
Figure 12B:
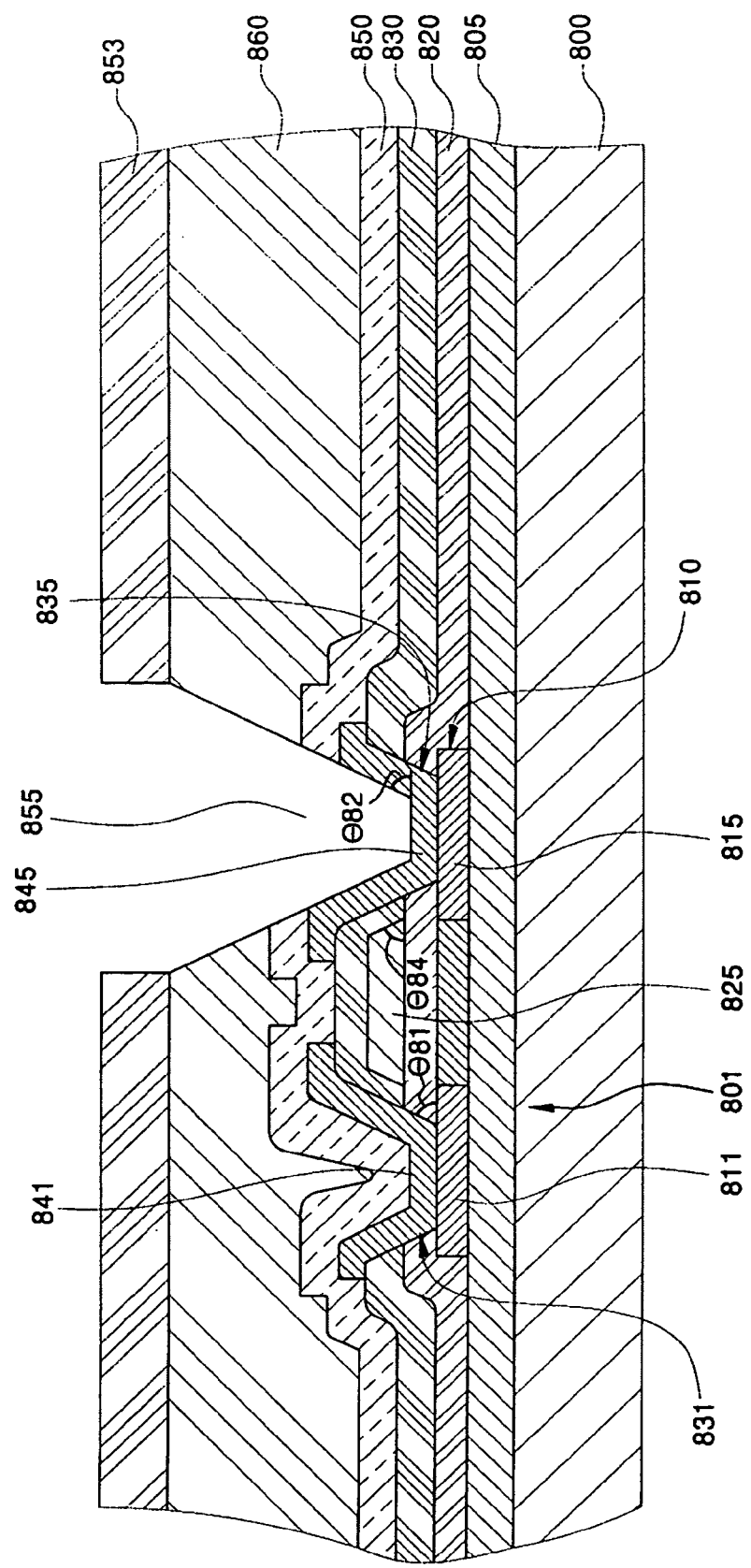

The second fabrication method for fabricating the OLED illustrated in FIGS. 12A and 12B differs from the first method illustrated in FIGS. 11A and 11B in that how the via hole is formed. In detail, an inorganic insulating layer such as a nitride layer is deposited as a passivation layer 850 on an interlayer insulating layer 830, a gate insulating layer 820 and a buffer layer 805 formed on an insulating substrate 800 where a thin film transistor 801 is formed, and the passivation layer 850 is dry etched so as to expose a drain electrode 845 among source and drain electrodes 841 and 845 of the thin film transistor 801 to thereby form a first via hole 854. A gate electrode 825 has a predetermined fourth taper angle θ84, and contact holes 831 and 835 have a predetermined first taper angle θ81 as is done in the first and second exemplary embodiments. The taper angles θ81 and θ84 are substantially the same as the taper angles θ61 and θ64, respectively, of FIG. 10.

As shown in FIG. 12B, a BCB layer as a planarizing layer is coated on the substrate and a photoresist layer 853 is then formed on a planarizing layer 860 to expose the first via hole 854. The planarizing layer 860 is dry etched using the photosensitive layer 853 as an etch mask to form a second via hole 855. The second via hole has a second taper angle θ82 of 60° or less, preferably 40° or less. The source and drain electrodes 841 and 845 are connected to source and drain regions 811 and 815 of a semiconductor layer 810 through the contact holes 831 and 835, respectively.

Figure 13A:
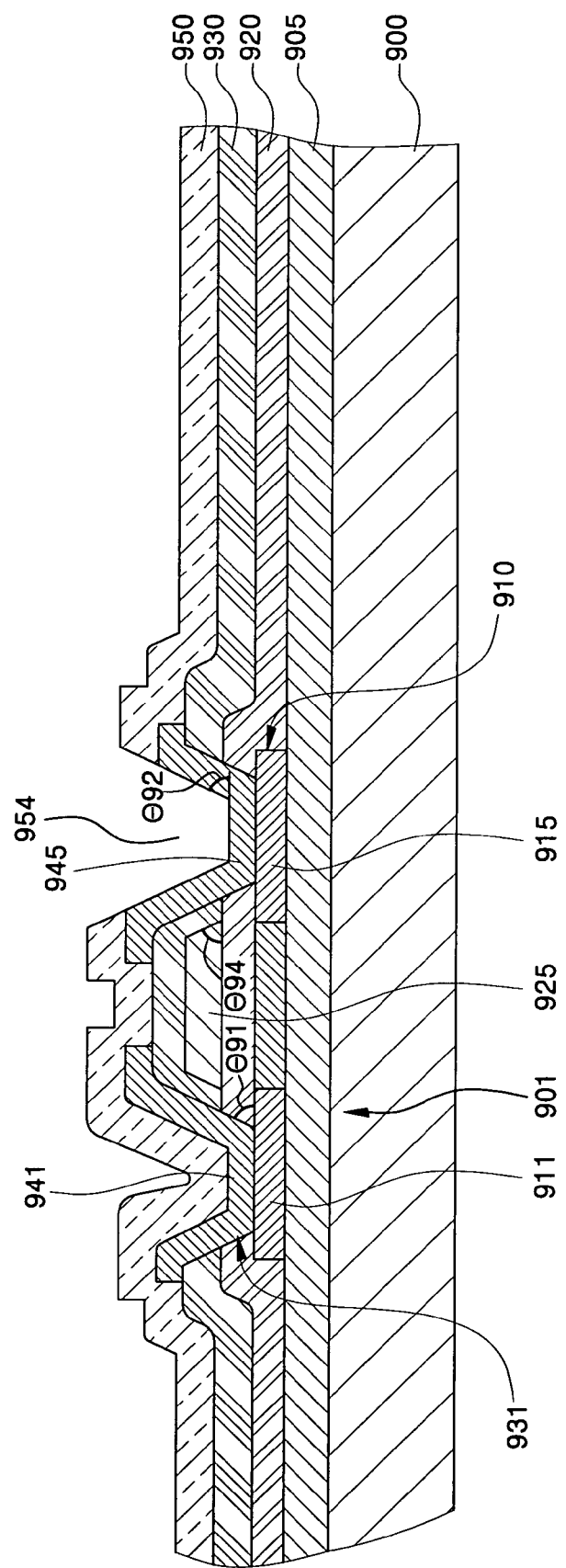
FIG. 13A and FIG. 13B are cross-sectional views which illustrate processes for a third method for fabricating an OLED in accordance with the third exemplary embodiment of the present invention.
Figure 13B:
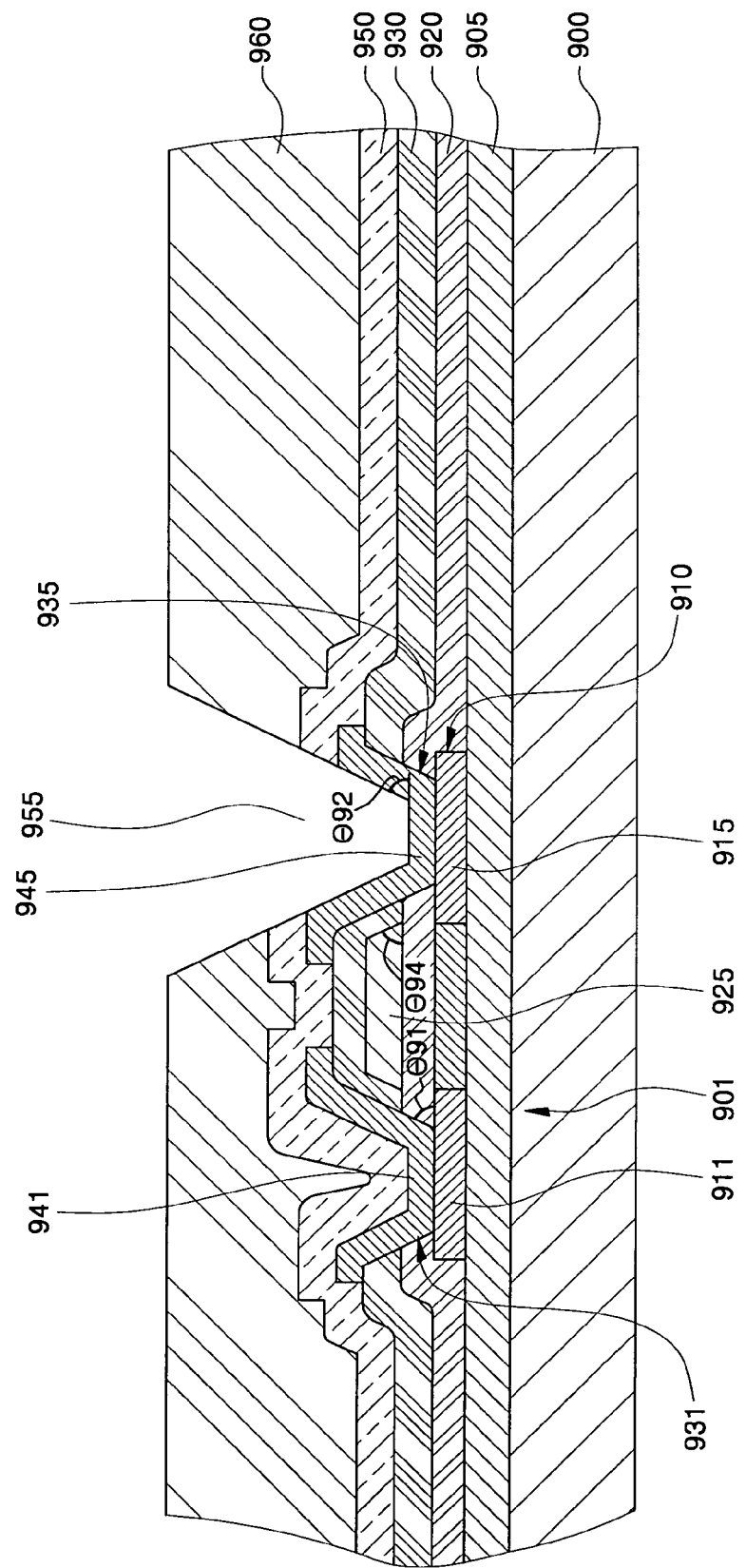

The third fabrication method of FIGS. 13A and 13B differs from the second method of FIGS. 12A and 12B in that how the via hole is formed using a photosensitive organic insulating layer. As shown in FIG. 13A, an inorganic insulating layer such as a nitride layer is deposited as a passivation layer 950 on an interlayer insulating layer 930, a gate insulating layer 920 and a buffer layer 905 formed on an insulating substrate 900 where a thin film transistor 901 is formed, and the passivation layer 950 is dry etched so as to expose a drain electrode 945 among source and drain electrodes 941 and 945 of the thin film transistor 901 to thereby form a first via hole 954. A gate electrode 925 has a predetermined fourth taper angle $\theta 94$, and contact holes 931 and 935 have a predetermined first taper angle $\theta 91$ as is done in the first and second exemplary embodiments. The taper angles $\theta 91$ and $\theta 94$ are substantially the same as the taper angles $\theta 61$ and $\theta 64$, respectively, of FIG. 10.

As shown in FIG. 13B, a photosensitive organic layer as a planarizing layer 960, for example, a photoreactive BCB layer or photoresist layer, is coated on the passivation layer 950 and is subject to an exposure process to thereby form a second via hole 955 for exposing the first via hole 954. The second via hole 955 has a taper angle $\theta 92$ of 60° or less, preferably 40° or less. The source and drain electrodes 941 and 945 are connected to source and drain regions 911 and 915 of a semiconductor layer 910 through the contact holes 931 and 935, respectively.

The OLED in accordance with the first to third exemplary embodiments of the present invention may be applied to a bottom-emitting structure where the anode as a lower electrode is formed to be a transmitting electrode and the cathode as an upper electrode is formed to be a reflective electrode. The OLED of the first to third exemplary embodiments may also be applied to a top-emitting structure where the anode as a lower electrode is formed to be a reflective electrode and the cathode as an upper electrode is formed to be a transmitting electrode. Further, the OLED of the first to third exemplary embodiments may be applied to a double-side-emitting structure where the anode as a lower electrode and the cathode as an upper electrode are formed to be transmitting electrodes.

In addition, while the first to third exemplary embodiments of the present invention have been described in reference to an OLED having the typical structure where an anode, an organic emission layer, and a cathode are sequentially formed, they may be also applied to the OLED having the inverted structure where the cathode, the organic emission layer, and the anode are sequentially formed. Further, they may be applied to the OLED in which the organic emission layer is formed using various methods such as a deposition method, an inkjet printing method, or a laser induced thermal imaging method.

In accordance with the present invention, the taper angles of a via hole, a contact hole, and a lower electrode are reduced, which allows to prevent defects of the contact hole and via hole and at the edge of the lower electrode, and to prevent defects of the organic emission layer, so that reliability and yield may be improved.

In addition, the pixel defining layer of the organic thin layer of the present invention may not be used in order to prevent element defects, which allows to prevent or reduce the defects due to the use of the pixel defining layer from occurring and also to simplify the process.

While the present invention has been described with reference to certain exemplary embodiments, it is understood that the disclosure has been made for the purposes of illustrating the present invention by way of examples and is not intended to limit the scope of the invention. Those skilled in the art would recognize that a variety of modification and change can be made without departing from the spirit or scope of the present invention described in the is claims appended below, and equivalents thereof.

What is claimed is:

1. A flat panel display, comprising:
an insulating substrate;
a lower conductive layer on the insulating substrate;
an upper conductive layer above the lower conductive layer; and
an insulating layer between the upper conductive layer and the lower conductive layer and having an interconnecting hole used for forming a contiguous contact between the upper conductive layer and the lower conductive layer,
wherein the interconnecting hole is tapered with a taper angle of 60° or less immediately adjacent the lower conductive layer, with respect to a surface of the insulating substrate, and
wherein the lower conductive layer includes source and drain regions of a thin film transistor, the upper conductive layer includes source and drain electrodes of the thin film transistor, and the interconnecting hole includes contact holes used for connecting the source and drain regions to the source and drain electrodes, respectively.

2. The flat panel display as claimed in claim 1, wherein the taper angle is 45° or less.

3. The flat panel display as claimed in claim 1, wherein the taper angle is at least 14°.

4. A flat panel display, comprising:
an insulating substrate;
a lower conductive layer on the insulating substrate;
an upper conductive layer above the lower conductive layer; and
an insulating layer between the upper conductive layer and the lower conductive layer and having an interconnecting hole used for forming a contiguous contact between the upper conductive layer and the lower conductive layer,
wherein the interconnecting hole is tapered with a taper angle of 60° or less immediately adjacent the lower conductive layer, with respect to a surface of the insulating substrate,
wherein the lower conductive layer is one of a source electrode and a drain electrode of a thin film transistor, the upper conductive layer is an anode, and the interconnecting hole is a via hole used for connecting said one of the source electrode and the drain electrode of the thin film transistor to the anode, and
wherein a gate electrode of the thin film transistor is tapered and has the same taper angle as the interconnecting hole.

5. A thin film transistor, comprising:
a semiconductor layer having a source region and a drain region on an insulating substrate;
a gate electrode above the semiconductor layer;
a source electrode connected to the source region of the semiconductor layer;
a drain electrode connected to the drain region of the semiconductor layer;
a gate insulating layer between the semiconductor layer and the gate electrode; and an interlayer insulating layer between the source and drain electrodes and the gate electrode, the interlayer insulating layer being a different layer from the gate insulating layer, wherein the gate insulating layer and the interlayer insulating layer have contact holes for connecting the source and drain regions to the source and drain electrodes, respectively, and each said contact hole is tapered with a taper angle of 60° or less immediately adjacent said source and drain electrodes with respect to a surface of the insulating substrate.

6. The thin film transistor as claimed in claim 5, wherein the taper angle is 45° or less.

7. The thin film transistor as claimed in claim 5, wherein a minimum value of the taper angle of each said contact hole is determined by the equation $\theta=\tan^{-1}(d2/d1)$, wherein d1 is a horizontal distance, from a position on one of the source and drain electrodes where a distance between said one of the source and drain electrodes and the gate electrode is minimum, to a bottom edge of a corresponding said contact hole, and wherein d2 is a sum of thicknesses of the gate insulating layer and the interlayer insulating layer at the position on said one of the source and drain electrodes where the distance between said one of the source and drain electrodes and the gate electrode is minimum.

8. A flat panel display, comprising:

a thin film transistor having at least source and drain electrodes on an insulating substrate;

an insulating layer having a via hole for exposing one of the source and drain electrodes; and an anode connected to said one of the source and drain electrodes through the via hole, wherein the via hole is tapered with a taper angle of 60° or less with respect to a surface of the insulating substrate, and the anode is tapered with a taper angle of 60° or less with respect to the surface of the insulating substrate.

9. The flat panel display as claimed in claim 8, wherein the taper angle of the via hole is 45° or less, and the taper angle of the anode is 45° or less.

10. The flat panel display as claimed in claim 8, wherein a minimum value of the taper angle of the anode is determined by the equation $\theta=\tan^{-1}(d1/d2)$, wherein d1 is the thickness of the anode, and wherein d2 is a difference between a length of a lower surface of the anode and length of an upper surface of the anode.

11. The flat panel display as claimed in claim 8, wherein the insulating layer contains at least one selected from an inorganic passivation layer and an organic planarizing layer.

12. A flat panel display, comprising:

a lower electrode on an insulating substrate;

an organic emission layer on the lower electrode; and an upper electrode on the organic emission layer, wherein the lower electrode is tapered with a taper angle of 60° or less with respect to a surface of the insulating substrate, and a minimum value of the taper angle of the lower electrode is determined by the equation $\theta=\tan^{-1}(d1/d2)$, wherein d1 is a thickness of the lower electrode, and wherein d2 is a difference between a length of a lower surface of the lower electrode and a length of an upper surface of the lower electrode.

13. The flat panel display as claimed in claim 12, wherein the taper angle of the lower electrode is 45° or less.

14. The flat panel display as claimed in claim 12, wherein the lower electrode is one of an anode and a cathode, and the upper electrode is the other one of the anode and the cathode.

15. The flat panel display as claimed in claim 12, wherein the lower electrode is a transmitting electrode, and the upper electrode is a reflective electrode, and light emitted from the organic emission layer is directed toward the substrate.

16. The flat panel display as claimed in claim 12, wherein the lower electrode is a reflective electrode, and the upper electrode is a transmitting electrode, and light emitted from the organic emission layer is directed in a direction away from the substrate.

17. The flat panel display as claimed in claim 12, wherein the lower electrode and the upper electrode are transmitting electrodes, and light emitted from the organic emission layer is directed both toward the substrate and in an opposite direction away from the substrate.

18. The flat panel display as claimed in claim 12, wherein the organic emission layer includes at least one thin layer selected from a hole injecting layer, a hole transporting layer, an emission layer, a hole blocking layer, an electron transporting layer, and an electron injecting layer.

19. The flat panel display as claimed in claim 12, wherein the organic emission layer is formed by a laser induced thermal imaging method, an inkjet printing method, or a deposition method.

20. A flat panel display, comprising:

an insulating substrate;

a semiconductor layer having source and drain regions of a thin film transistor on the insulating substrate;

a first insulating layer having contact holes for exposing a portion of the source region and a portion of the drain region;

source and drain electrodes connected respectively to the source and drain regions through the contact holes;

a second insulating layer on the first insulating layer and having a via hole for exposing one of the source and drain electrodes;

a lower electrode on the second insulating layer and connected to said one of the source and drain electrodes of the thin film transistor through the via hole;

an organic emission layer on the lower electrode; and an upper electrode on the organic emission layer, wherein the via hole is tapered with a taper angle of 60° or less with respect to a surface of the insulating substrate, and the lower electrode is tapered with a taper angle of 60° or less with respect to the surface of the insulating substrate.

21. The flat panel display as claimed in claim 20, wherein the taper angle of the via hole is in a range of 14° to 45°, and the taper angle of the lower electrode is in a range of 2.9° to 45°.

22. The flat panel display as claimed in claim 20, wherein the second insulating layer has a structure including an insulating layer for passivation and an insulating layer for planarization that are layered together.

23. The flat panel display as claimed in claim 20, wherein the lower electrode is one of an anode and a cathode, and the upper electrode is the other one of the anode and the cathode.

24. The flat panel display as claimed in claim 20, wherein the organic emission layer includes at least one thin layer selected from a hole injecting layer, a hole transporting layer, an emission layer, a hole blocking layer, an electron transporting layer, and an electron injecting layer, and the organic emission layer is formed by a laser induced thermal imaging method, an inkjet printing method, or a deposition method.

25. The flat panel display as claimed in claim 20, wherein the lower electrode acts as any one of reflective and transmitting electrodes, and the upper electrode acts as a transmitting electrode, and light emitted from the organic emission layer is directed in a direction away from the substrate, or directed in both a direction toward the substrate and in an opposite direction away from the substrate.

26. A flat panel display, comprising:
an insulating substrate;
a semiconductor layer having source and drain regions of a thin film transistor on the insulating substrate;
a gate electrode over the semiconductor layer;
a first insulating layer between the semiconductor layer and the gate electrode;
a second insulating layer having contact holes for exposing a portion of the source region and a portion of the drain region;
source and drain electrodes connected respectively to the source and drain regions through the contact holes;
a third insulating layer on the second insulating layer and having a via hole for exposing one of the source and drain electrodes;
a lower electrode on the third insulating layer and connected to said one of the source and drain electrodes of the thin film transistor through the via hole;
an organic emission layer on the lower electrode; and
an upper electrode on the organic emission layer,
wherein the via hole and the contact holes are tapered with taper angles of 60° or less with respect to a surface of the insulating substrate, and the lower electrode is tapered with a taper angle of 60° or less with respect to the surface of the insulating substrate.

27. The flat panel display as claimed in claim 26, wherein the contact holes and the via hole have the taper angles in a range of 14° to 45°, and the lower electrode has the taper angle in a range of 2.9° to 45°.

28. The flat panel display as claimed in claim 26, wherein the lower electrode acts as a transmitting electrode, and the upper electrode acts as any one of reflective and transmitting electrodes, and light emitted from the organic emission layer is directed toward the substrate, or directed both toward the substrate arid in an opposite direction away from the substrate.

29. The flat panel display as claimed in claim 26, wherein the gate electrode is tapered and has the same taper angle as the contact holes.

30. The flat panel display as claimed in claim 26, wherein the organic emission layer includes at least one thin layer selected from a hole injecting layer, a hole transporting layer, an emission layer, a hole blocking layer, an electron transporting layer, and an electron injecting layer, and the organic emission layer is formed by a laser induced thermal imaging method, an inkjet printing method, or a deposition method.

* * * * *

UNITED STATES PATENT AND TRADEMARK OFFICE
CERTIFICATE OF CORRECTION

PATENT NO. : 7,656,087 B2
APPLICATION NO. : 10/938080
DATED : February 2, 2010
INVENTOR(S) : Mu-Hyun Kim et al.

It is certified that error appears in the above-identified patent and that said Letters Patent is hereby corrected as shown below:

In the Claims

Column 16, Claim 28, line 13    Delete "arid" Insert -- and --

Signed and Sealed this
Thirty-first Day of May, 2011

David J. Kappos
*Director of the United States Patent and Trademark Office*